US012676291B2

(12) United States Patent
Kobayashi

(10) Patent No.: US 12,676,291 B2
(45) Date of Patent: Jul. 7, 2026

(54) IGNITION CONTROL METHOD, FILM FORMATION METHOD, AND SUBSTRATE PROCESSING APPARATUS

(71) Applicant: Tokyo Electron Limited, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 121 days.

(21) Appl. No.: 18/602,234

(22) Filed: Mar. 12, 2024

(65) Prior Publication Data

US 2024/0312763 A1 Sep. 19, 2024

(30) Foreign Application Priority Data

Mar. 17, 2023 (JP) ................................. 2023-042466

(51) Int. Cl.
*H01J 37/32* (2006.01)
(52) U.S. Cl.
CPC ...... *H01J 37/32174* (2013.01); *H01J 37/321* (2013.01); *H01J 37/32449* (2013.01)
(58) Field of Classification Search
None
See application file for complete search history.

(56) References Cited

U.S. PATENT DOCUMENTS

| | | | | |
|---|---|---|---|---|
| 2009/0124087 A1* | 5/2009 | Nodera | ................. | C23C 16/345 |
| | | | | 156/345.43 |
| 2024/0312763 A1* | 9/2024 | Kobayashi | ............ | H01J 37/321 |
| 2024/0328782 A1* | 10/2024 | Yamazaki | .............. | G01B 21/08 |
| 2024/0404849 A1* | 12/2024 | Watanabe | ......... | H01L 21/67253 |
| 2025/0079139 A1* | 3/2025 | Kobayashi | ........ | H01J 37/32522 |

FOREIGN PATENT DOCUMENTS

JP 2010-238881 A 10/2010

* cited by examiner

*Primary Examiner* — Kenneth B Wells
(74) *Attorney, Agent, or Firm* — Venjuris, P.C.

(57) ABSTRACT

An ignition control method includes: preparing a substrate processing apparatus including a processing container that accommodates a substrate, a plasma box formed in the processing container, an electrode disposed on the plasma box, a radio-frequency (RF) power supply connected to the electrode via a matching unit, and a switch disposed between the matcher and the electrode; setting the switch during a process performed by the substrate processing apparatus based on a recipe; and after setting the switch, selecting a region for igniting a plasma generated from a gas by applying a radio-frequency voltage from the RF power supply.

8 Claims, 10 Drawing Sheets

MODIFYING GAS/NITRIDING GAS →

RAW MATERIAL GAS →

IGNITION CONTROL METHOD, FILM FORMATION METHOD, AND SUBSTRATE PROCESSING APPARATUS

CROSS-REFERENCE TO RELATED APPLICATIONS

This application is based on and claims priority from Japanese Patent Application No. 2023-042466, filed on Mar. 17, 2023, with the Japan Patent Office, the disclosure of which is incorporated herein in its entirety by reference.

TECHNICAL FIELD

The present disclosure relates to an ignition control method, a film formation method, and a substrate processing apparatus.

BACKGROUND

Japanese Patent Laid-Open Publication No. 2010-238881 discloses that a radio-frequency power supply may operate in a power modulation mode in which a radio-frequency power is power-modulated at a predetermined period, and in the power modulation mode, a matching operation of a matching unit switches in synchronization with the power modulation. Accordingly, first and second variable capacitors in the matching unit are smoothly controlled without repeating fine movements, so that plasma is stabilized, and the lifetime of the first and second variable capacitors is lengthened.

SUMMARY

According to an aspect of the present disclosure, an ignition control method includes: preparing a substrate processing apparatus including a processing container that accommodates a substrate, a plasma box formed in the processing container, an electrode disposed on the plasma box, a radio-frequency (RF) power supply connected to the electrode via a matcher, and a switch disposed between the matcher and the electrode; setting the switch during a process performed by the substrate processing apparatus based on a recipe; and after setting the switch, selecting a region for igniting a plasma generated from a gas by applying a radio-frequency voltage from the RF power supply.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are views illustrating an example of voltages of voltage supply lines and an electrode-to-electrode voltage according to an embodiment.

DETAILED DESCRIPTION

Figure 1:
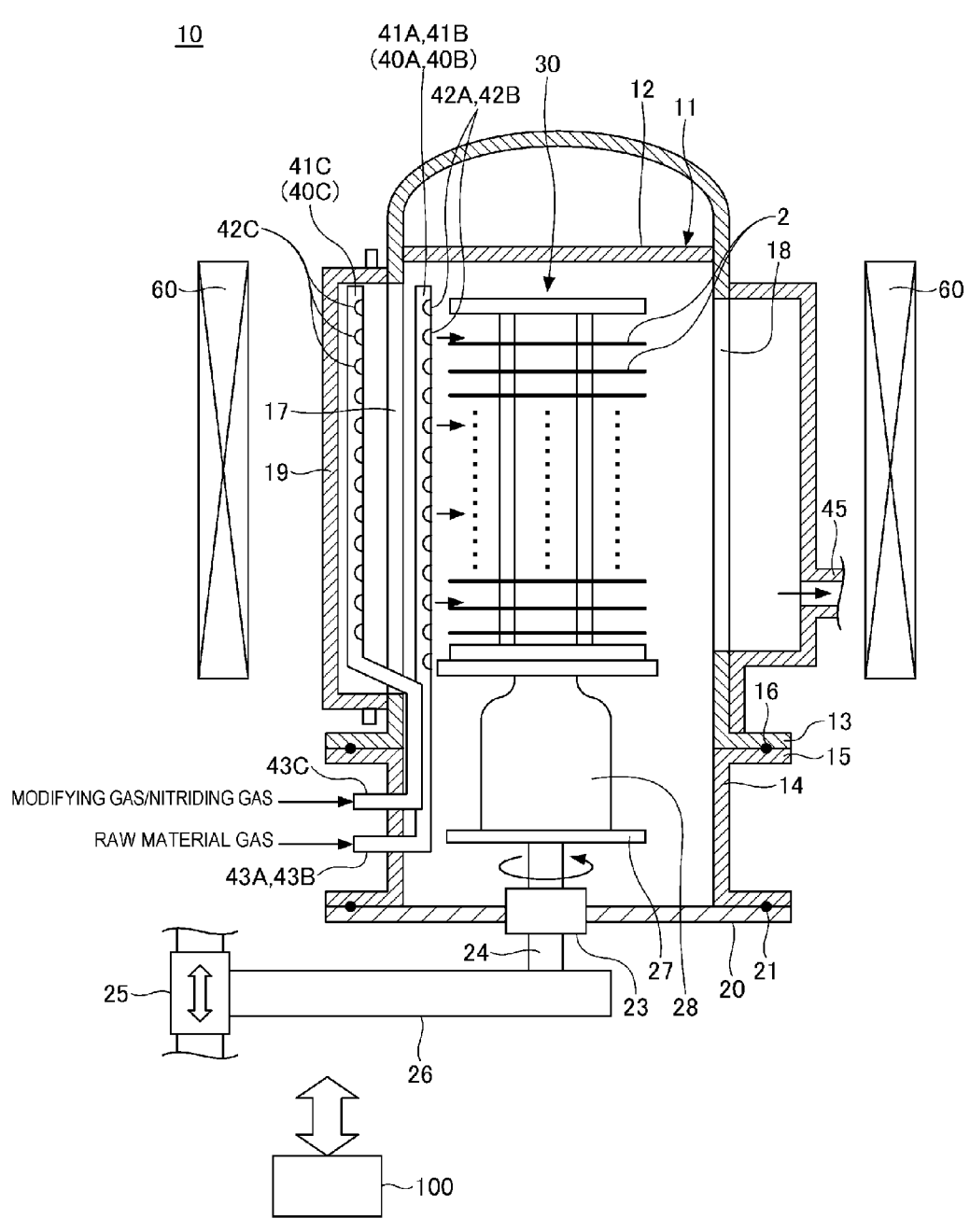
FIG. 1 is a view illustrating the structure of a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

Substrate Processing Apparatus

First, a substrate processing apparatus 10 according to an embodiment will be described with reference to FIG. 1. FIG. 1 is a view illustrating the substrate processing apparatus 10 according to the embodiment. The substrate processing apparatus 10 accommodates a plurality of wafers 2 in a processing container 11, and forms a film on the plurality of wafers 2 using an atomic layer deposition (ALD) method. The substrate processing apparatus 10 is an example of an apparatus that performs the film formation method.

The substrate processing apparatus 10 is a batch-type vertical heat treatment apparatus, which processes the plurality of wafers 2. However, the substrate processing apparatus 10 is not limited to a heat treatment apparatus. For example, the substrate processing apparatus 10 may be a single-wafer type apparatus, which processes wafers one by one. Further, the substrate processing apparatus 10 may be a semi-batch type apparatus, which processes several substrates at once. The semi-batch type apparatus may be an apparatus, in which a plurality of wafers arranged around a rotation center line of a rotary table are rotated together with the rotary table to sequentially pass through a plurality of areas supplied with different gases.

A film formed on the plurality of wafers 2 may be, for example, any of a nitride film, an oxide film, and an oxynitride film. In conventional film formation methods, the in-plane film thickness of each wafer 2 may become thick at, for example, the edge of the wafer 2, which causes the lack of uniformity, requiring a further adjustment of the film thickness. Thus, an ignition control method and a film formation method according to embodiments of the present disclosure to be described later provide a technology for improving the selectivity of a region in a substrate process-
ing apparatus where plasma is to be ignited, and thereby,
further improving the film thickness and film quality of a
film formed on the wafers 2.

Hereinafter, descriptions will be made assuming an
example where a silicon nitride (SiN) film is formed. The
silicon nitride film is formed on a wafer by alternately
supplying a raw material gas (e.g., dichlorosilane (DCS):
$SiH_2Cl_2$) gas) and a plasma of a nitriding gas (e.g., ammonia
($NH_3$) gas) to the wafer. The nitriding gas is an example of
a reaction gas.

The substrate processing apparatus 10 includes a process-
ing container 11 that accommodates the wafers 2 and has
therein a space where the wafers 2 are processed, a lid 20
that airtightly closes an opening at the lower end of the
processing container 11, and a substrate holder 30 that holds
the wafers 2. Each wafer 2 is, for example, a semiconductor
substrate, and more particularly, for example, a silicon
wafer. The substrate holder 30 is also called a wafer boat.

The processing container 11 includes a ceilinged cylin-
drical processing container main body 12 with an opening at
the lower end thereof. The processing container main body
12 is made of, for example, quartz. A flange unit 13 is
formed at the lower end of the processing container main
body 12. The processing container 11 further includes a
manifold 14 having, for example, a cylindrical shape. The
manifold 14 is made of, for example, a stainless steel. A
flange unit 15 is formed at the upper end of the manifold 14,
and the flange unit 13 of the processing container main body
12 is provided on the flange unit 15. A seal member 16 such
as an O-ring is disposed between the flange unit 13 and the
flange unit 15.

The lid 20 is airtightly attached to the opening at the lower
end of the manifold 14 via a seal member 21 such as an
O-ring. The lid 20 is made of, for example, a stainless steel.
A through hole is formed at the center of the lid 20 to
penetrate the lid 20 in the vertical direction. A rotary shaft
24 is disposed in the through hole. A magnetic fluid seal unit
23 seals the gap between the lid 20 and the rotary shaft 24.
The lower end of the rotary shaft 24 is rotatably supported
by an arm 26 of a lifting unit 25. A rotation plate 27 is
provided on the upper end of the rotary shaft 24. The
substrate holder 30 is provided on the rotation plate 27 via
a heat insulating base 28.

The substrate holder 30 holds the plurality of wafers 2 to
be vertically spaced apart from each other. Each of the
plurality of wafers 2 is horizontally held. The substrate
holder 30 is made of, for example, quartz ($SiO_2$) or silicon
carbide (SiC). When the lifting unit 25 is moved up, the lid
20 and the substrate holder 30 move up, and the substrate
holder 30 is carried into the processing container 11, so that
the opening at the lower end of the processing container 11
is sealed by the lid 20. When the lifting unit 25 is moved
down, the lid 20 and the substrate holder 30 move down, and
the substrate holder 30 is carried out from the processing
container 11. When the rotary shaft 24 is rotated, the
substrate holder 30 rotates together with the rotation plate
27.

The substrate processing apparatus 10 includes three gas
supply pipes 40A, 40B, and 40C. The gas supply pipes 40A,
40B, and 40C are made of, for example, quartz ($SiO_2$). The
gas supply pipes 40A, 40B, and 40C supply gases into the
processing container 11. The type of each gas will be
described later. One gas supply pipe may eject one type of
gas or various types of gas in sequence. Further, a plurality
of gas supply pipes may eject the same type of gas.

The gas supply pipes 40A, 40B, and 40C include hori-
zontal pipes 43A, 43B, and 43C that horizontally penetrate
the manifold 14, and vertical pipes 41A, 41B, and 41C that
are arranged vertically inside the processing container 11.
The vertical pipes 41A, 41B, and 41C include a plurality of
gas supply ports 42A, 42B, and 42C arranged at intervals in
the vertical direction. A gas supplied to the horizontal pipes
43A, 43B, and 43C is sent to the vertical pipes 41A, 41B,
and 41C, and ejected horizontally from the plurality of gas
supply ports 42A, 42B, and 42C. The vertical pipe 41C is
disposed inside a plasma box 19. The vertical pipes 41A and
41B are arranged inside the processing container 11.

The substrate processing apparatus 10 includes an exhaust
pipe 45. The exhaust pipe 45 is connected to an exhaust
system (not illustrated). The exhaust system includes a
vacuum pump to evacuate the inside of the processing
container 11. An exhaust port 18 is formed in the processing
container main body 12 to exhaust the inside of the pro-
cessing container 11. The exhaust port 18 is disposed to face
the gas supply ports 42A, 42B, and 42C. The gas horizon-
tally ejected from the gas supply ports 42A, 42B, and 42C
passes through the exhaust pipe 18, and then, is exhausted
from the exhaust pipe 45. The exhaust system sucks the gas
inside the processing container 11, and sends the gas to a
detoxifying apparatus. The detoxifying apparatus removes
harmful components from the exhausted gas, and then,
discharges the exhausted gas into the atmosphere.

The substrate processing apparatus 10 further includes a
heating unit 60. The heating unit 60 is disposed outside the
processing container 11, and heats the inside of the process-
ing container 11 from the outside of the processing container
11. For example, the heating unit 60 is formed in a cylin-
drical shape to surround the processing container main body
12. The heating unit 60 is configured with, for example, an
electric heater. The heating unit 60 heats the inside of the
processing container 11, thereby improving the capability of
processing a gas supplied into the processing container 11.

Plasma Box

Figure 2:
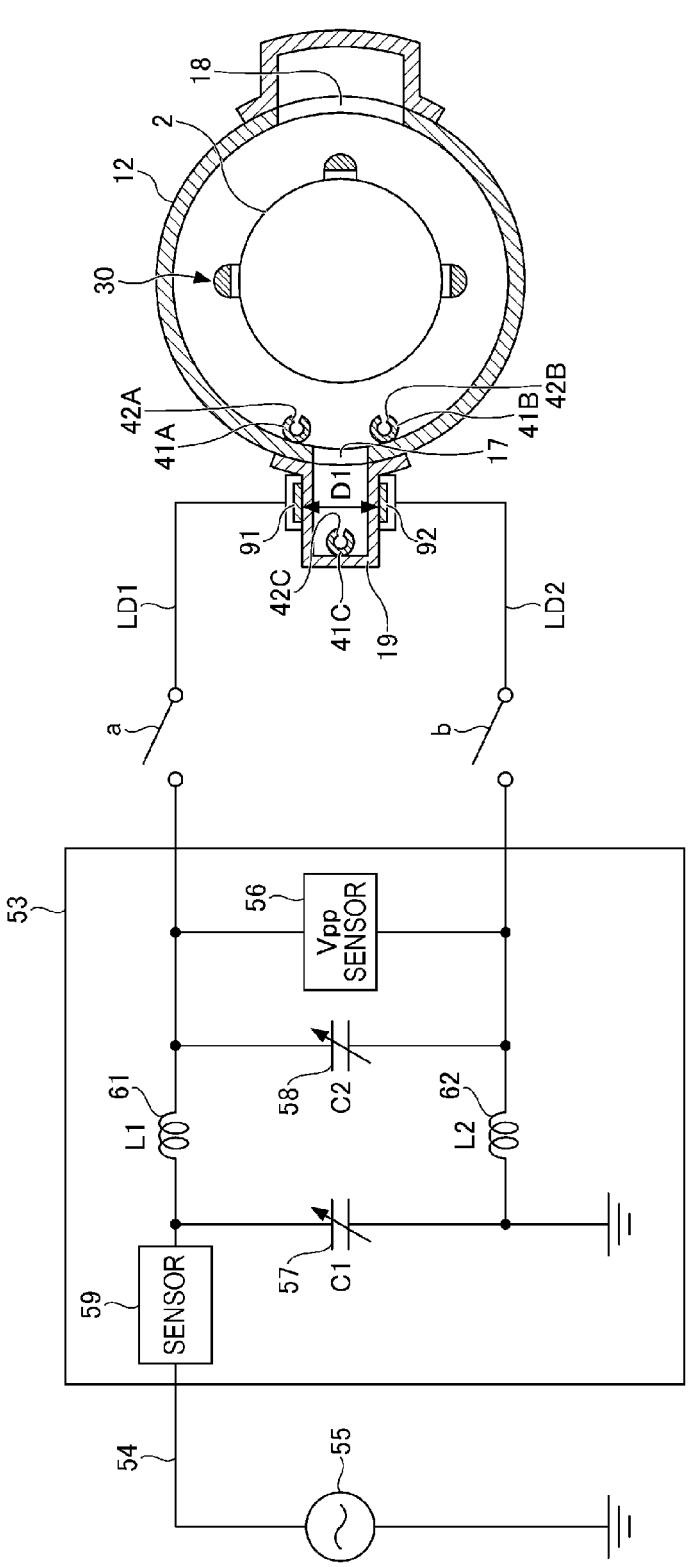
FIG. 2 is a view illustrating an example of a connection circuit between a matching unit and electrodes according to an embodiment.

FIG. 2 is a view illustrating an example of a connection
circuit between a matching unit and electrodes according to
an embodiment. As illustrated in FIGS. 1 and 2, an opening
17 is formed in a portion of the processing container main
body 12 in the circumferential direction. The plasma box 19
is formed in the side surface of the processing container 11
to surround the opening 17. The plasma box 19 is formed to
protrude radially outward from the processing container
main body 12, and formed, for example, in a U shape when
viewed in the vertical direction.

A pair of electrodes (electrode pair) 91 and 92 are
arranged to sandwich the plasma box 19 therebetween. The
electrode pair 91 and 92 is a pair of parallel electrodes
provided facing each other on the external side of the plasma
box 19. The electrode pair 91 and 92 is formed to be
vertically elongated, similar to the vertical pipe 41C, while
facing each other. The electrode pair 91 and 92 is connected
to an RF power supply 55 via a matching unit 53, and a
radio-frequency voltage is applied from the RF power
supply 55.

The matching unit 53 is connected in series between the
RF power supply 55 and the electrode pair 91 and 92 via
voltage supply lines LD1 and LD2 and a voltage supply line
54. A first switch "a" and a second switch "b" are disposed
between the matching unit 53 and the electrode pair 91 and
92. The first switch "a" and the second switch "b" may be
provided inside or outside the matching unit 53. In the present embodiment, the first switch "a" and the second switch "b" are provided outside the matching unit 53. The matching unit 53 includes a first variable capacitor 57 (C1), a second variable capacitor 58 (C2), and coils 61 and 62 (L1, L2: fixed inductances). The matching unit 53 further includes a sensor 59 and a Vpp sensor 56. The first switch "a," the coil 61, and the sensor 59 are connected in series to the voltage supply line LD1 in an order from the side of the electrode 91. The second switch "b" and the coil 62 are connected in series to the voltage supply line LD2 in an order from the side of the electrode 92, and one end of the coil 62 is grounded. The Vpp sensor 56, the first variable capacitor 57, and the second variable capacitor 58 are connected in parallel to the voltage supply lines LD1 and LD2 in an order from the side of the electrode pair 91 and 92.

As illustrated in FIG. 1, the substrate processing apparatus 10 includes a control device 100. The control device 100 controls the setting of the first switch "a" and the second switch "b" according to the ignition control method to be described later. Further, the control device 100 controls the sensor 59 to detect a reflected wave of the radio-frequency voltage applied from the RF power supply 55 to the electrode pair 91 and 92, and changes the mechanical adjustment positions of the first variable capacitor 57 and the second variable capacitor 58 according to the detected reflected wave. Changing the mechanical adjustment positions refers to controlling the rotation of motors (not illustrated) for the first variable capacitor 57 and the second variable capacitor 58, respectively. Accordingly, the capacitances C1 and C2 of the first variable capacitor 57 and the second variable capacitor 58 are adjusted. In this way, the matching unit 53 adjusts its own impedance, thereby matching the output impedance of the RF power supply 55 and the load impedance on the side of plasma. The Vpp sensor 56 detects the voltage applied between the electrode pair 91 and 92 (the voltage applied to the distance D1 of FIG. 2). Separate sensors may be provided to detect the voltage applied to the voltage supply line LD1 where the first switch "a" is disposed and the voltage applied to the voltage supply line LD2 where the second switch "b" is disposed.

Gas Supply

The plasma box 19 accommodates the vertical pipe 41C for the modifying gas and the nitriding gas, which are each an example of a reaction gas. The modifying gas is ejected horizontally toward the opening 17 from the gas supply ports 42C of the vertical pipe 41C, and supplied into the processing container main body 12 through the opening 17. Similarly, the nitriding gas is ejected horizontally toward the opening 17 from the gas supply ports 42C of the vertical pipe 41C, and supplied into the processing container main body 12 through the opening 17.

The vertical pipes 41A and 41B for the raw material gas are disposed outside the plasma box 19, and are arranged outside the opening 17 inside the processing container main body 12. The vertical pipe 41B may be provided inside the plasma box 19 to supply the nitriding gas separately from the vertical pipe 41C for the modifying gas.

When the radio-frequency voltage is applied between the electrode pair 91 and 92, a radio-frequency electric field is formed in the internal space of the plasma box 19. The modifying gas is converted into plasma by the radio-frequency electric field in the internal space of the plasma box 19. When the modifying gas contains nitrogen gas, the nitrogen gas is converted into plasma so that nitrogen radicals are generated. When the modifying gas contains hydrogen gas, the hydrogen gas is converted into plasma so that hydrogen radicals are generated. When the modifying gas contains ammonia gas, the ammonia gas is converted into plasma so that ammonia radicals are generated. These active species are supplied into the processing container main body 12 through the opening 17, to modify a Si-containing layer.

The modification of the Si-containing layer includes, for example, removing a halogen element contained in the Si-containing layer. By removing the halogen element, dangling bonds of Si may be formed. As a result, the Si-containing layer may be activated, and the nitriding of the Si-containing layer may be accelerated. In the present embodiment, the nitriding of the Si-containing layer is performed after the modification of the Si-containing layer.

Figure 3:
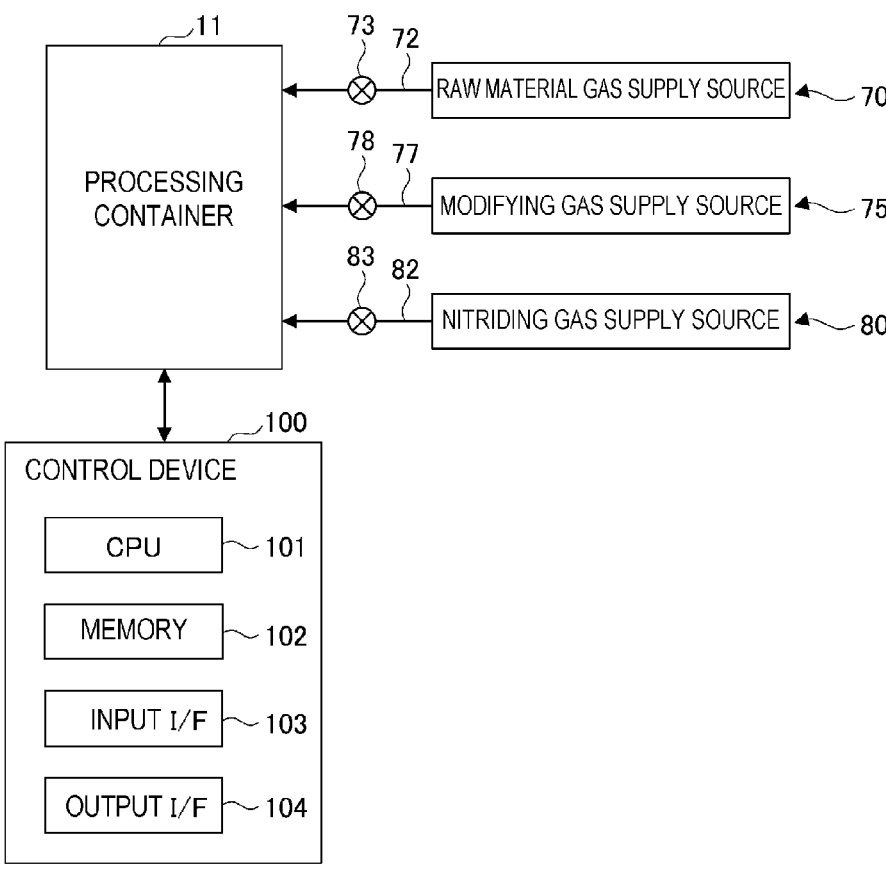
FIG. 3 is a diagram illustrating a gas supply source and a control device of the substrate processing apparatus.

FIG. 3 is a diagram illustrating the gas supply unit and the control device of the substrate processing apparatus 10 according to an embodiment. In the substrate processing apparatus 10, the gas supply unit includes a raw material gas supply source 70, a modifying gas supply source 75, and a nitriding gas supply source 80. The raw material gas supply source 70 supplies the raw material gas into the processing container 11. The raw material gas contains an element to be nitrided (e.g., silicon).

As for the raw material gas, for example, dichlorosilane (DCS) gas is used. While the raw material gas in the present embodiment is the DCS gas, the technology of the present disclosure is not limited thereto. As for the raw material gas other than the DCS gas, for example, monochlorosilane (MCS: $SiH_3Cl$) gas, trichlorosilane (TCS: $SiHCl_3$) gas, silicon tetrachloride (STC: $SiCl_4$) gas, and hexachlorodisilane (HCDS: $Si_2Cl_6$) gas may be used. By supplying this gas to the wafers 2, a layer containing silicon (Si) (a Si-containing layer) may be formed on the wafers 2. Since the raw material gas contains a halogen element, the Si-containing layer contains the halogen element, in addition to Si.

A raw material gas pipe 72 connects the raw material gas supply source 70 and the gas supply pipes 40A and 40B, and sends the raw material gas from the raw material gas supply source 70 to the gas supply pipes 40A and 40B. The raw material gas is ejected horizontally toward the wafers 2 from the gas supply ports 42A and 42B of the vertical pipes 41A and 41B. A raw material gas flow rate control valve 73 is provided in the middle of the raw material gas pipe 72 to control the flow rate of the raw material gas.

The modifying gas supply source 75 supplies the modifying gas into the processing container 11 to modify the Si-containing layer. The modification of the Si-containing layer includes, for example, removing a halogen element contained in the Si-containing layer. By removing the halogen element, dangling bonds of Si may be formed. As a result, the Si-containing layer may be activated, and the nitriding of the Si-containing layer may be accelerated. As for the modifying gas, nitrogen gas, hydrogen gas, ammonia gas, or a gas containing any one of the gases may be used.

A modifying gas pipe 77 connects the modifying gas supply source 75 and the gas supply pipe 40C, and sends the modifying gas from the modifying gas supply source 75 to the gas supply pipe 40C. The modifying gas is ejected horizontally toward the wafers 2 from the gas supply ports 42C of the vertical pipe 41C. A modifying gas flow rate control valve 78 is provided in the middle of the modifying gas pipe 77 to control the flow rate of the modifying gas.

The nitriding gas supply source 80 supplies the nitriding gas into the processing container 11 to nitride the Si-containing layer. As for the nitriding gas, for example, ammonia ($NH_3$) gas, organic hydrazine compound gas, amine-based gas, NO gas, $N_2O$ gas, or $NO_2$ gas is used. As for the organic hydrazine compound gas, for example, hydrazine ($N_2H_4$) gas, diazene ($N_2H_2$) gas, or monomethylhydrazine (MMH) gas is used. As for the amine-based gas, for example, monomethylamine gas is used.

A nitriding gas pipe 82 connects the nitriding gas supply source 80 and the gas supply pipe 40C, and sends the nitriding gas from the nitriding gas supply source 80 to the gas supply pipe 40C. The nitriding gas is ejected horizontally toward the wafers 2 from the gas supply ports 42C of the vertical pipe 41C. A nitriding gas flow rate control valve 83 is provided in the middle of the nitriding gas pipe 82 to control the flow rate of the nitriding gas.

A purge gas supply source (not illustrated) may be provided. By supplying a purge gas into the processing container 11, the raw material gas, the modifying gas, and the nitriding gas that remain inside the processing container 11 are removed. As for the purge gas, for example, an inert gas is used. As for the inert gas, a noble gas such as Ar gas, or $N_2$ gas is used.

As illustrated in FIG. 3, the control device 100 that controls the substrate processing apparatus 10 is configured with, for example, a computer, and includes a central processing unit (CPU) 101 and a memory 102. The memory 102 stores programs for controlling various processes performed in the substrate processing apparatus 10. The control device 100 causes the CPU 101 to execute programs stored in the memory 102 so as to control the operation of the substrate processing apparatus 10. Further, the control device 100 causes the CPU 101 to execute a recipe stored in the memory 102 so as to enable the substrate processing apparatus 10 to execute a desired process. In the recipe, conditions for each step of the ignition control method and the film formation method are set. The control device 100 further includes an input interface 103 and an output interface 104. The control device 100 receives a signal from the outside through the input interface 103, and transmits a signal to the outside through the output interface 104.

The programs may be stored in a computer-readable storage medium, and installed in the memory 102 of the control device 100 from the storage medium. Examples of the computer-readable storage medium include a hard disk (HD), a flexible disk (FD), a compact disk (CD), a magnet optical disk (MO), and a memory card. Further, the programs may be downloaded from a server through the Internet, and installed in the memory 102 of the control device 100.

Switch Setting

The ignition control method performed in the substrate processing apparatus 10 includes: setting the first switch "a" and the second switch "b" during a process performed by the substrate processing apparatus 10 based on a recipe; and after the setting of the first switch "a" and the second switch "b," selecting a region for igniting plasma generated from the modifying gas or the nitriding gas by applying the radio-frequency voltage from the RF power supply 55.

As illustrated in FIG. 2, the first switch "a" is an example of a first switch disposed in the voltage supply line LD1 that connects the matching unit 53 and the electrode 91, which is one of the electrode pair 91 and 92 arranged to sandwich the plasma box 19 therebetween. The second switch "b" is an example of a second switch disposed in the voltage supply line LD2 that connects the matching unit 53 and the electrode 92, which is the other of the electrode pair 91 and 92.

Figures 4A, 4B, 4C:
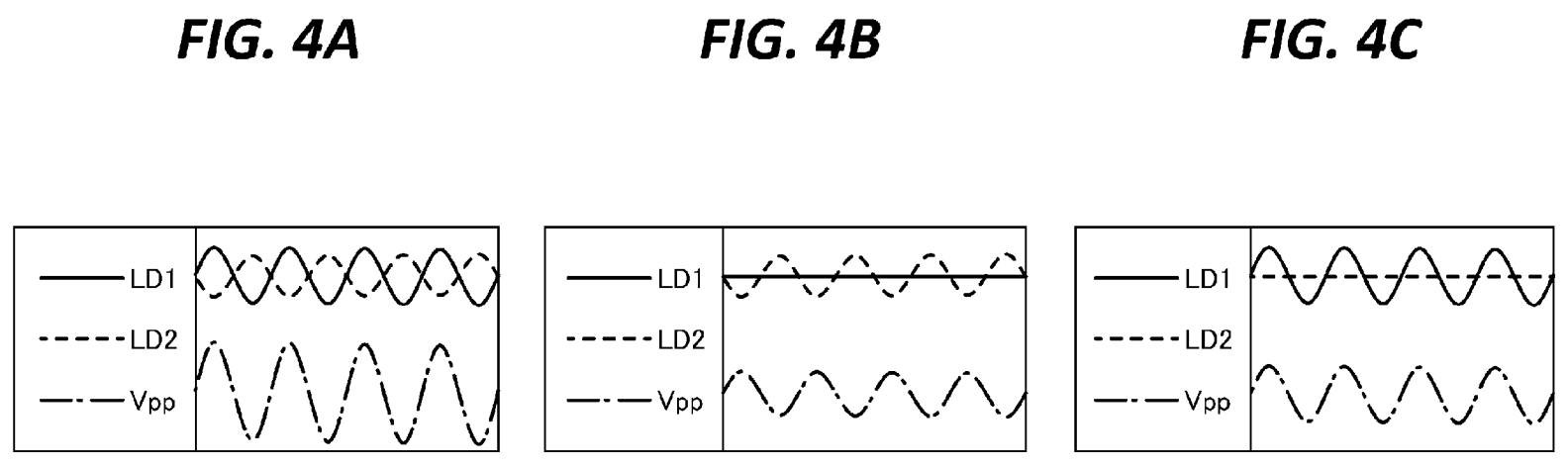

The control device 100 may control the setting of the first switch "a" and the second switch "b," thereby controlling the selection of the plasma ignition region from the plasma box 19 and the processing container 11. The setting of the first switch "a" and the second switch "b" and the selection of the plasma ignition region will be described with reference to FIGS. 4A to 4C. FIGS. 4A to 4C are views illustrating an example of the voltages of the voltage supply lines LD1 and LD2 and the electrode-to-electrode voltage.

FIGS. 4A to 4C illustrate the voltage of the voltage supply line LD1, the voltage of the voltage supply line LD2, and the electrode-to-electrode voltage Vpp when ON/OFF of the first switch "a" and the second switch "b" are set. The voltage Vpp is the voltage in the distance D1 between the electrode pair 91 and 92, and has a value obtained by adding the inverse-phase voltage of LD2 to the voltage of LD1.

FIG. 4A illustrates the voltage of the voltage supply line LD1, the voltage of the voltage supply line LD2, and the electrode-to-electrode voltage Vpp when the first switch "a" and the second switch "b" are turned "ON" (connected). The voltage of LD1 and the voltage of LD2 are inverted 180° in phase, and the peak-to-peak voltage of the electrode-to-electrode voltage Vpp obtained by adding the inverse-phase voltage of LD2 to the voltage of LD1 becomes the maximum.

FIG. 4B illustrates the voltage of the voltage supply line LD1, the voltage of the voltage supply line LD2, and the electrode-to-electrode voltage Vpp when the first switch "a" is turned OFF (disconnected), and the second switch "b" is turned ON. Since the first switch "a" is turned OFF, the voltage of the voltage supply line LD1 is 0, and the inverse-phase voltage of the voltage supply line LD2 becomes the electrode-to-electrode voltage Vpp.

FIG. 4C illustrates the voltage of the voltage supply line LD1, the voltage of the voltage supply line LD2, and the electrode-to-electrode voltage Vpp when the first switch "a" is turned ON, and the second switch "b" is turned OFF. Since the second switch "b" is turned OFF, the voltage of the voltage supply line LD2 is 0, and the voltage of the voltage supply line LD1 becomes the electrode-to-electrode voltage Vpp.

As illustrated in FIG. 4A, the peak-to-peak voltage (amplitude) of the electrode-to-electrode voltage Vpp becomes the maximum when the first switch "a" and the second switch "b" are turned ON. Thus, the maximum voltage that facilitates the plasma ignition in the plasma box 19 is applied to the electrode pair 91 and 92, so that plasma is selectively ignited in the plasma box 19.

As illustrated in FIGS. 4B and 4C, when one of the first switch "a" and the second switch "b" is turned ON, and the other is turned OFF, the peak-to-peak voltage (amplitude) of the electrode-to-electrode voltage Vpp becomes about half of that when the first switch "a" and the second switch "b" are turned ON. Thus, by setting one of the first switch "a" and the second switch "b" to ON and the other to OFF, it is possible to apply the voltage that facilitates the plasma ignition in the region of the processing container 11 rather than the plasma box 19, so that plasma is selectively ignited in the processing container 11. In this way, by setting ON/OFF of the first switch "a" and the second switch "b" during a process, it is possible to improve the selectivity of the plasma ignition region in the substrate processing apparatus 10.

The first switch "a" and the second switch "b" are set before a process (when starting a process), and thereafter, the setting of the first switch "a" and the second switch "b" is performed again after the start of the process or during the process. For example, when starting a process, the first switch "a" and the second switch "b" may be set to the ON or OFF state.

Matching Unit: Modification 1

Figure 5:
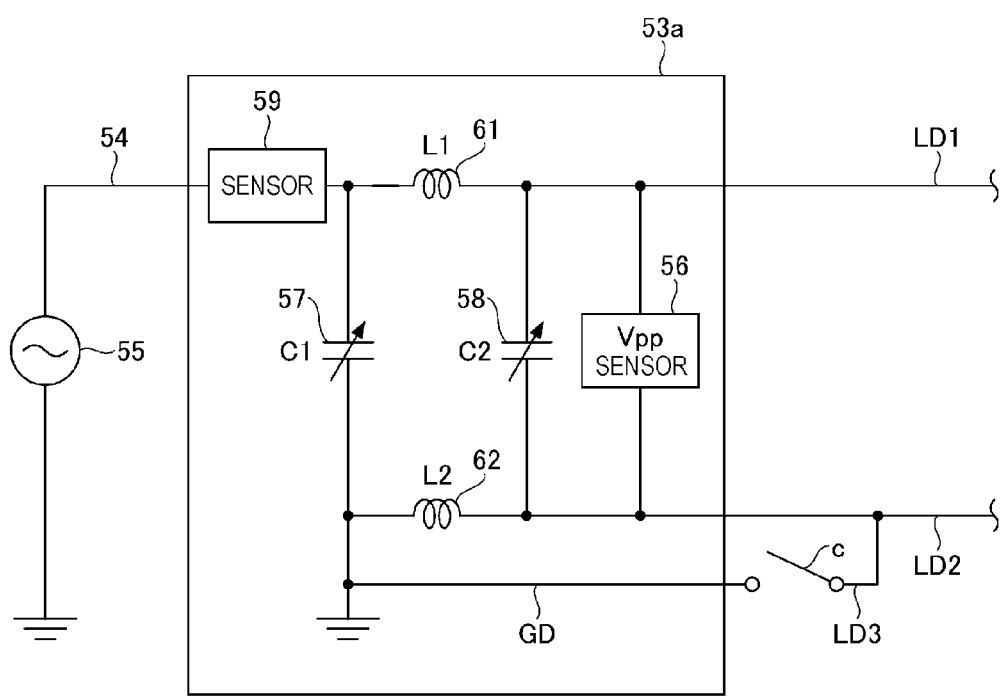
FIG. 5 is a view illustrating an example of a connection circuit between a matching unit and electrodes according to Modification 1.

The ignition control method performed in the substrate processing apparatus 10 may use a connection circuit between a matching unit and electrodes according to Modification 1 illustrated in FIG. 5. FIG. 5 is a view illustrating an example of a connection circuit between a matching unit 53a and the electrode pair 91 and 92 according to Modification 1.

The configuration of the matching unit 53a according to Modification 1 is the same as that of the matching unit 53 illustrated in FIG. 2. In Modification 1, the first switch "a" and the second switch "b" are not present, and a third switch "c" is provided. The third switch "c" is disposed in a voltage supply line LD3 that connects one of the electrode pair 91 and 92 arranged to sandwich the plasma box 19 therebetween to the ground potential GD of the matching unit 53a. The voltage supply line LD3 branches from the voltage supply line LD2 and is connected to the ground potential GD. The third switch "c" may be provided inside or outside the matching unit 53a. In the present embodiment, the third switch "c" is provided outside the matching unit 53a. In Modification 1, no switch is provided in the voltage supply line LD1.

Figure 6B:
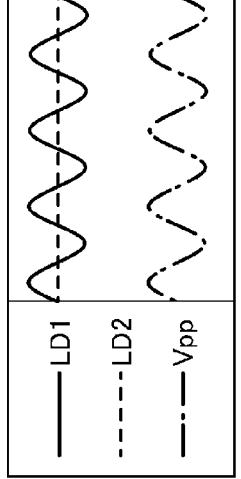
FIGS. 6A and 6B are views illustrating an example of voltages of voltage supply lines and an electrode-to-electrode voltage according to Modification 1.
Figure 6A:
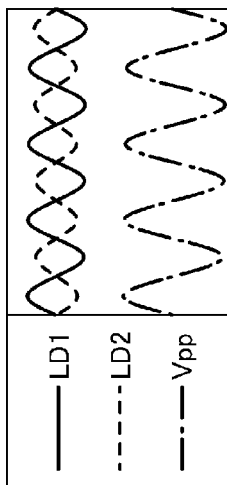

FIGS. 6A and 6B are views illustrating an example of the voltages of the voltage supply lines and the electrode-to-electrode voltage according to Modification 1. FIG. 6A illustrates the voltage of the voltage supply line LD1, the voltage of the voltage supply line LD2, and the electrode-to-electrode voltage Vpp when the third switch "c" is turned OFF (disconnected). The voltage of the voltage supply line LD1 and the voltage of the voltage supply line LD2 are inverted 180° in phase, and the peak-to-peak voltage of the electrode-to-electrode voltage Vpp obtained by adding the inverse-phase voltage of LD2 to the voltage of the voltage of LD1 becomes the maximum.

FIG. 6B illustrates the voltage of the voltage supply line LD1, the voltage of the voltage supply line LD2, and the electrode-to-electrode voltage Vpp when the third switch "c" is turned ON (connected). Since the third switch "c" is turned ON, the voltage of the voltage supply line LD2 is 0, and the voltage of the voltage supply line LD1 becomes the electrode-to-electrode voltage Vpp.

As illustrated in FIG. 6A, the peak-to-peak voltage (amplitude) of the electrode-to-electrode voltage Vpp becomes the maximum when the third switch "c" is turned OFF. Thus, the voltage that facilitates the plasma ignition in the plasma box 19 is applied to the electrode pair 91 and 92, so that plasma is ignited in the plasma box 19.

As illustrated in FIG. 6B, when the third switch "c" is turned ON, the peak-to-peak voltage (amplitude) of the electrode-to-electrode voltage Vpp becomes about half of that when the third switch "c" is turned OFF. As a result of the setting of the third switch "c," the voltage is controlled to the voltage that facilitates the plasma ignition in the processing container 11 rather than the plasma box 19. Thus, the plasma ignition is performed in the processing container 11. In this way, by controlling the setting of the third switch "c" during a process, the region in the substrate processing apparatus 10 where plasma is to be ignited may be selected from the plasma box 19 and the processing container 11, which may improve the selectivity of the plasma ignition region.

Figure 7A:
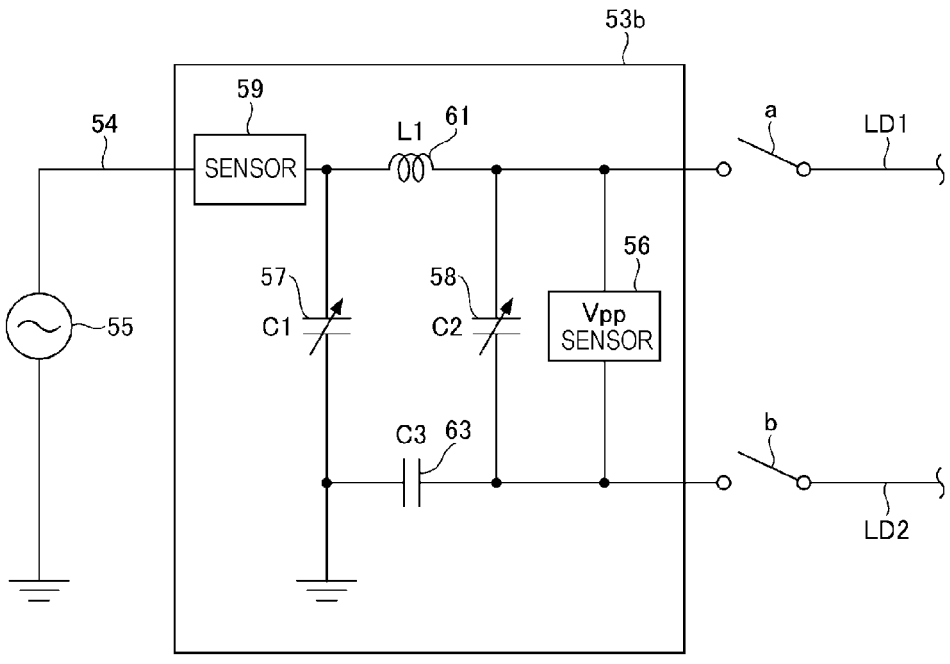
FIGS. 7A and 7B are views illustrating an example of a connection circuit between a matching unit and electrodes according to Modification 2.
Figure 7B:
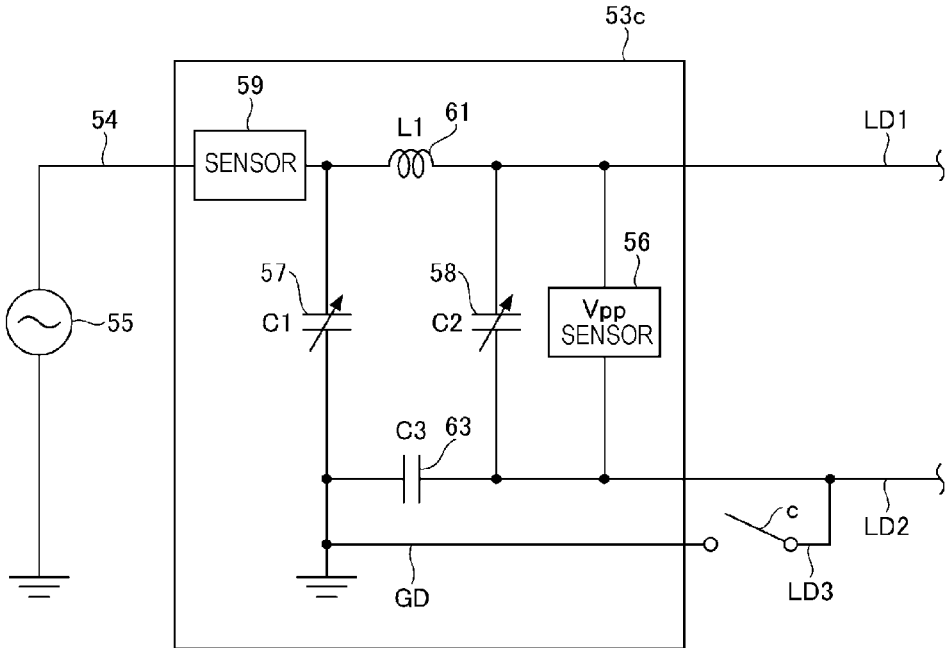

FIG. 7A is a view illustrating an example of a connection circuit between a matching unit 53b and the electrode pair 91 and 92 according to Modification 2. FIG. 7B is a view illustrating an example of a connection circuit between a matching unit 53c and the electrode pair 91 and 92 according to Modification 3.

The configuration of the matching unit 53b of Modification 2 illustrated in FIG. 7A is the same as that of the matching unit 53 illustrated in FIG. 2, except that in Modification 2, a capacitor 63 (C3) is disposed instead of the coil 62 in the matching unit 53 illustrated in FIG. 2.

The configuration of the matching unit 53c of Modification 3 illustrated in FIG. 7B is the same as that of the matching unit 53a illustrated in FIG. 5, except that in Modification 3, a capacitor 63 (C3) is disposed instead of the coil 62 in the matching unit 53a illustrated in FIG. 5.

The capacitors 63 in FIGS. 7A and 7B may be variable capacitors or fixed capacitors. In the present embodiment, the capacitors 63 are fixed capacitors.

The circuits illustrated in FIGS. 2, 5, 7A, and 7B are merely examples of the connection circuit between a matching unit and electrodes for implementing the ignition control method, and the circuit configuration is not limited thereto. For example, the first variable capacitor 57 and the second variable capacitor 58 may be variable coils. The matching unit may be an electronic matcher.

First Embodiment

Ignition Control Method and Film Formation Method

Figure 8:
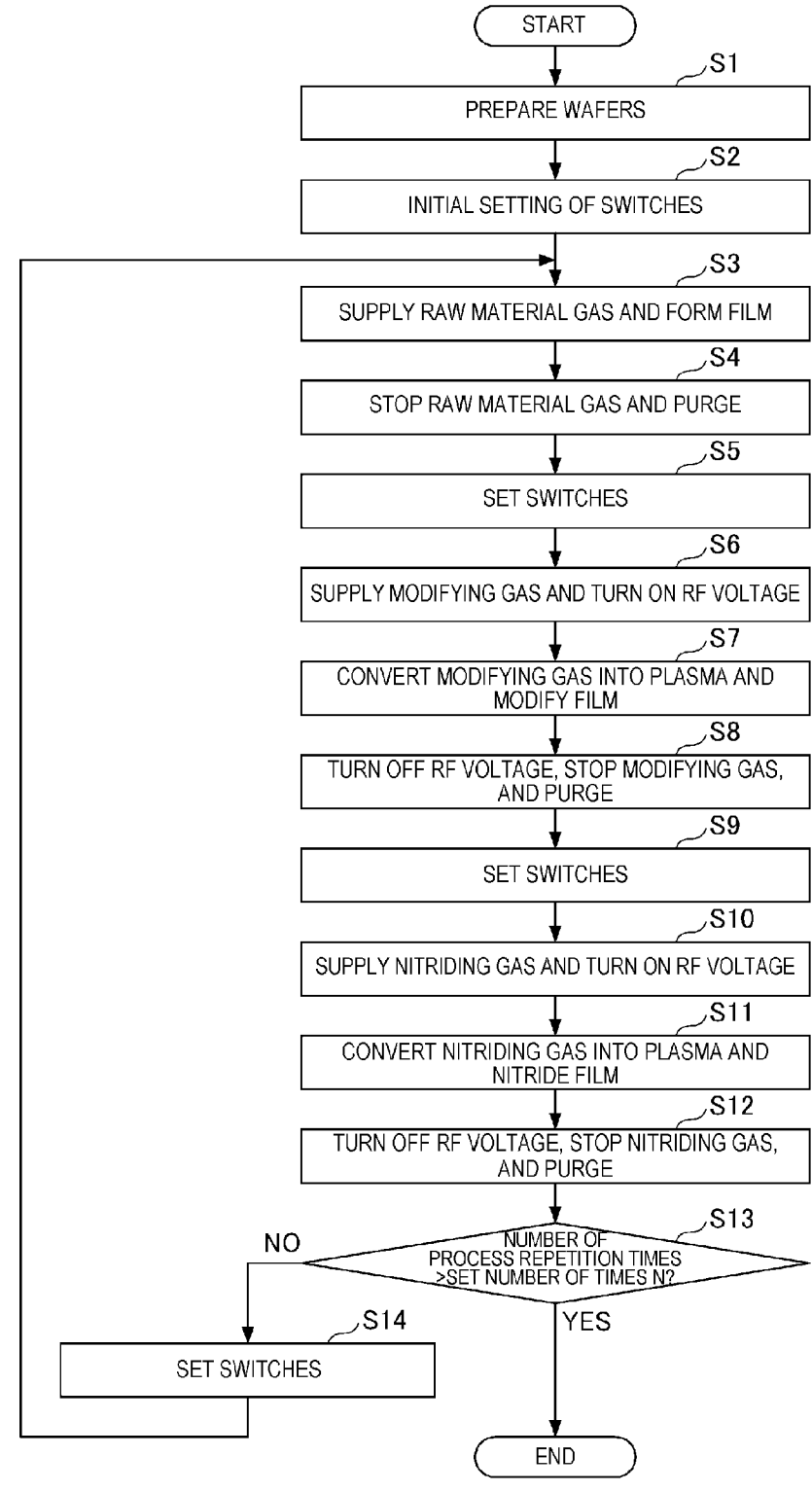
FIG. 8 is a flowchart illustrating an example of an ignition control method and a film formation method according to a first embodiment.
Figure 9:
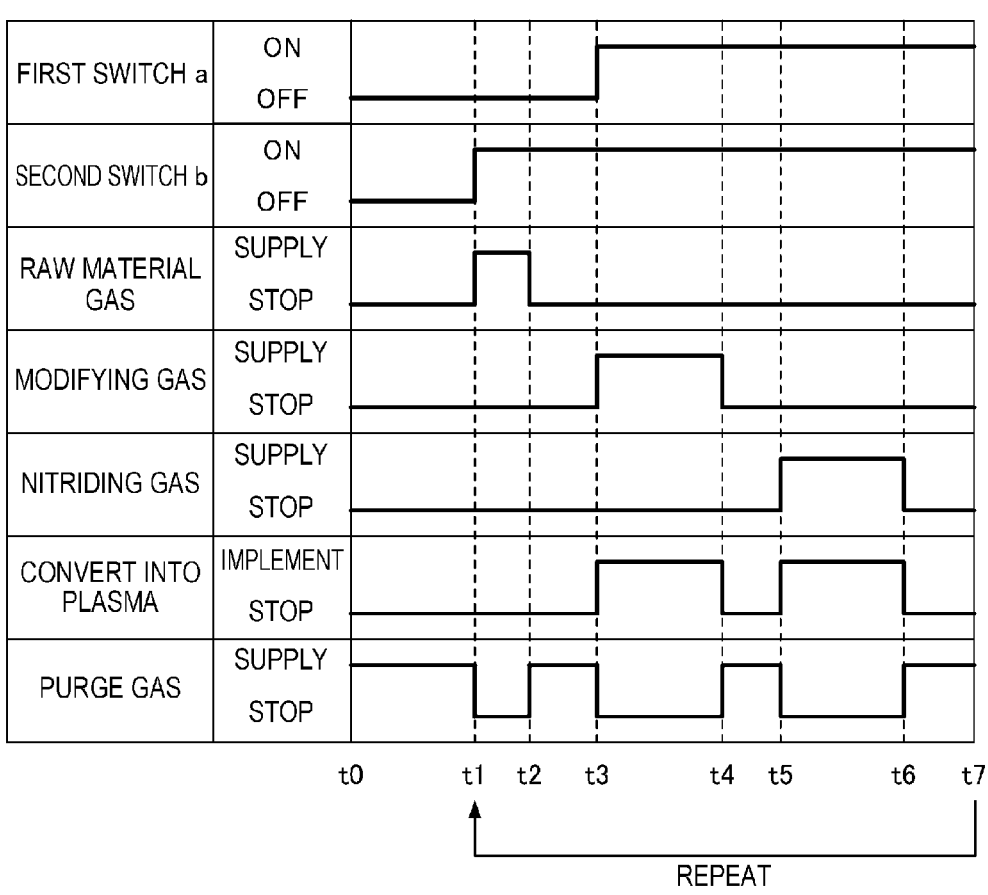
FIG. 9 is a time chart illustrating an example of the ignition control method and the film formation method according to the first embodiment.

Next, an ignition control method and a film formation method according to a first embodiment will be described with reference to FIGS. 8 and 9. FIG. 8 is a flowchart illustrating the ignition control method and the film formation method according to the first embodiment. FIG. 9 is a time chart illustrating the ignition control method and the film formation method according to the first embodiment. The ignition control method in the present embodiment is performed by the substrate processing apparatus 10 and controlled by the control device 100. The substrate processing apparatus 10 performs a process for forming a nitride film on the plurality of wafers 2 by the atomic layer deposition (ALD) method that repeatedly performs a plurality of steps on the plurality of wafers 2 accommodated in the processing container. The film formed on the wafers is not limited to a nitride film. The ignition control method according to the present embodiment will be described taking the circuit configuration in FIG. 2 as an example. The ignition control method according to the present embodiment may be performed using the circuit configuration shown in any one of FIGS. 5, 7A, and 7B.

When the present method starts, in step S1, the control device 100 carries the substrate holder 30 holding the wafers 2 into the processing container 11. In step S1, a transfer apparatus loads the plurality of wafers 2 on the substrate holder 30 outside the processing container 11. The substrate holder 30 holds the plurality of wafers 2 to be vertically spaced apart from each other while each is held horizontally. Subsequently, the lifting unit 25 is moved up to move up the lid 20 and the substrate holder 30. The wafers 2 are carried into the processing container 11 along with the substrate holder 30, and the opening at the lower end of the processing container 11 is sealed by the lid 20.

In the time chart of FIG. 9, the timing "t0" indicates the initial state, at which the first switch "a" and the second switch "b" are turned OFF. Further, at the timing t0, the raw material gas, the modifying gas, and the nitriding gas are not supplied, the plasma generation is not performed (the RF voltage is not applied from the RF power supply 55), and only the purge gas is supplied. The purge gas may be nitrogen gas, argon gas, other inert gases, or a combination of these gases.

Subsequently, in step S2, the control device 100 initializes the setting of the switches by setting the first switch "a" to the OFF (disconnected) state, and sets the second switch "b" to the ON (connected) state.

Subsequently, in step S3, the control device 100 supplies the raw material gas to adsorb the raw material gas onto the substrates. In step S3, the control device 100 forms an Si-containing layer. The raw material gas is supplied from the timing t1 to the timing t2 illustrated in FIG. 9. The supply of the purge gas is stopped from the timing t1 and the timing t2.

In step S3, the raw material gas is supplied from the raw material gas supply source 70 into the processing container 11 while exhausting the inside of the processing container 11 by the exhaust system connected to the exhaust pipe 45. The raw material gas is, for example, dichlorosilane (DCS) gas. As a result, the Si-containing layer is formed on the wafers 2. The time for performing step S3 is, for example, 1 second to 10 seconds.

Subsequently, in step S4, the control device 100 performs a purging step. Step S4 is performed from the timing t2 to the timing t3 illustrated in FIG. 9. At the timing t2 of FIG. 9, the control device 100 stops the supply of the raw material gas, and supplies the purge gas into the processing container 11 while exhausting the inside of the processing container 11 by the exhaust system. As a result, the gas remaining inside the processing container 11 is replaced with the purge gas. The time for performing step S4 is, for example, 3 seconds to 10 seconds. The purge gas may be supplied from, for example, the nitriding gas supply source 80.

Subsequently, in steps S5 to S7, the control device 100 performs a switch setting step and a modifying step. The control device 100 sets the switches in step S5 before generating plasma in steps S6 and S7. Step S5 is performed at the timing t3 illustrated in FIG. 9, to set the first switch "a" to ON. Accordingly, the first switch "a" and the second switch "b" are turned ON, and the maximum voltage that facilitates the plasma ignition in the plasma box 19 is applied to the electrode pair 91 and 92, so that plasma is selectively ignited in the plasma box 19 during step S7.

Steps S6 and S7 are performed from the timing t3 to the timing t4 illustrated in FIG. 9. The supply of the purge gas is stopped from the timing t3 and the timing t4. In step S6, the modifying gas is supplied from the modifying gas supply source 75 into the processing container 11 while exhausting the inside of the processing container 11 by the exhaust system. Further, in step S6, the radio-frequency voltage is applied from the RF power source 55. As a result, plasma is ignited in the plasma box 19, and the modifying gas is converted into plasma, so that the Si-containing layer on the wafers 2 is modified.

The ignition control method according to the present embodiment is performed in steps 5 and 7. At this time, the controller 100 controls the ON/OFF states of the first switch "a" and the second switch "b," such that either one of the plasma box 19 and the processing container 11 is selected as the plasma ignition region. Steps S5 to S7 correspond to an example where the first switch "a" and the second switch "b" are set to ON to select the plasma box 19 as the plasma ignition region.

The modifying gas is, for example, nitrogen gas. The modifying gas may be hydrogen gas or ammonia gas. The modifying gas may be a gas including nitrogen gas or hydrogen gas. The Si-containing layer is modified with the modifying gas converted into plasma. The modification of the Si-containing layer includes, for example, removing the halogen element included in the Si-containing layer. By removing the halogen element, dangling bonds of Si may be formed. As a result, the Si-containing layer may be activated, and the nitriding of the Si-containing layer may be accelerated. The frequency of the radio-frequency of the RF power supply 55 is, for example, 13.56 MHz or 14.56 MHz. The time for performing steps S7 to S9 is, for example, 3 seconds to 60 seconds.

Subsequently, in step S8, the control device 100 performs a purging step. Step S8 is performed from the timing t4 to the timing t5 illustrated in FIG. 9. At the timing t4 of FIG. 9, the control device 100 stops the supply of the modifying gas, and stops the application of the radio-frequency voltage. Further, while exhausting the inside of the processing container 11 by the exhaust system, the control device 100 supplies the purge gas into the processing container 11, to replace the gas remaining inside the processing container 11 with the purge gas. The time for performing step S8 is, for example, 3 seconds to 10 seconds. The purge gas may be, for example, nitrogen gas, and may be supplied from, for example, the nitriding gas supply source 80.

Subsequently, in steps S9 to S11, the control device 100 performs a switch setting step and a nitriding step. Steps S9 to S11 are performed from the timing t5 to the timing t6 illustrated in FIG. 9. The supply of the purge gas is stopped from the timing t5 and the timing t6. The control device 100 sets the first switch "a" and the second switch "b" to ON in step S9 before generating plasma in steps S10 and S11. Thus, the maximum voltage that facilitates the plasma ignition in the plasma box 19 is applied to the electrode pair 91 and 92, so that plasma is selectively ignited in the plasma box 19. Here, step S9 may be omitted when the first switch "a" and the second switch "b" are already in the ON state. In the example of FIG. 9, step S9 is omitted because the first switch "a" and the second switch "b" are in the ON state at the timing t5.

In step S10, the nitriding gas is supplied into the processing container 11 by the nitriding gas supply source 80 while exhausting the inside of the processing container 11 by the exhaust system. Further, in step S10, the radio-frequency voltage is applied from the RF power supply 55. As a result, plasma is ignited in the plasma box 19, and the nitriding gas is converted into plasma, so that the Si-containing layer on the wafers 2 is modified.

The ignition control method according to the present embodiment is performed by steps S9 to S11. At this time, the control device 100 controls the ON/OFF states of the first switch "a" and the second switch "b," such that either one of the plasma box 19 and the processing container 11 is selected as the plasma ignition region. Steps S9 to S11 correspond to an example where the first switch "a" and the second switch "b" are set to ON to select the plasma box 19 as the plasma ignition region.

The nitriding gas is, for example, ammonia gas. The Si-containing layer is nitrided with the ammonia gas converted into plasma. The time for performing steps S9 to S11 is, for example, 5 seconds to 120 seconds.

Subsequently, in step S12, the control device 100 performs a purging step. Step S12 is performed from the timing t6 to the timing t7 illustrated in FIG. 9. At the timing t6 of FIG. 9, the control device 100 stops the supply of the nitriding gas and the application of the radio-frequency voltage. Further, while exhausting the inside of the processing container 11 by the exhaust system, the purge gas is supplied into the processing container 11 to replace the gas remaining inside the processing container 11 with the purge gas. The time for performing step S12 is, for example, 3 seconds to 10 seconds. The purge gas may be, for example, nitrogen gas, and may be supplied from, for example, the nitriding gas supply source 80.

Subsequently, in step S13, the control device 100 determines whether the process has been repeated more times than a set number of times N (N≤1). The set number of times N is set in advance. When it is determined that the process has not repeated more times than the set number of times N, the control device 100 proceeds with step S14 to perform the setting of the switches, and then, returns to step S3 to repeat the cycle including steps S3 to S12. In step S14, the control device 100 sets the first switch "a" to OFF. Here, either the first switch "a" or the second switch "b" may be set to OFF.

When it is determined in step S13 that the process has been repeated more times than the set number of times N, the control device 100 terminates the process since the silicon nitride film with the desired film thickness and film quality and the high in-plane uniformity has been formed.

Effects

In the film formation method described above, the purging step may be omitted. Further, the modifying steps S5 to S7 may be omitted. The film formation method according to the present embodiment is a film formation method that performs a process including the following steps based on a recipe: (a) supplying a raw material gas to adsorb the raw material gas onto the substrates; and (b) supplying a reaction gas to cause a reaction of the raw material gas adsorbed onto the substrates by plasma generated from the reaction gas, and in step (b), the ignition control method according to the present embodiment is performed. That is, in step (b), the setting of the switches is performed, and accordingly, the plasma ignition region may be selected from the plasma box and the processing container.

Further, the film formation method according to the present embodiment may be a film formation method that is performed in the substrate processing apparatus 10 and performs the following process based on a recipe. The process includes performing a first sequence, which includes at least one step, a first set number of times, and performing a second sequence, which includes at least one step, a second set number of times after performing the first sequence. In a step of generating plasma during the first sequence and the sequence sequence, the plasma ignition region may be selected by setting the switches, and then, applying the radio-frequency voltage from the RF power supply.

For example, there is a case where a user desires to change the gas species from one gas to another gas and change the plasma ignition region, between the first and second sequences in a state where the radio-frequency voltage is set to ON. Conventionally, when the gas is changed between the first and second sequences, the reflected wave of the radio-frequency voltage may increase, resulting in the occurrence of an abnormal discharge. Thus, in the related art, the gas is changed after setting the radio-frequency voltage to OFF, and thereafter, the radio-frequency voltage is set to ON again to perform the sequence of changing the plasma ignition region. This method makes it difficult to improve the productivity.

Meanwhile, in the ignition control method according to the present embodiment, the gas is changed and the plasma ignition region is controlled even without setting the radio-frequency voltage to OFF, so that the plasma ignition region may be selected from the plasma box 19 and the processing container 11 without causing the occurrence of an abnormal discharge. As a result, the controllability of the film thickness and film quality of a film formed on the wafers 2 may be improved.

For example, the modifying gas may be changed to the nitriding gas without performing the purging between the timing t4 and the timing t5 in FIG. 9, and plasma may be generated while maintaining the ON state of the radio-frequency voltage without setting the radio-frequency voltage to OFF from the timing t4 to the timing t5. In this case as well, the plasma ignition region may be selected from the plasma box 19 and the processing container 11 in the substrate processing apparatus 10 by setting ON/OFF of the first switch "a" and the second switch "b."

Accordingly, even in a two-step process that ignites plasma in the plasma box 19, and subsequently, ignites plasma in the processing container 11, or a process that cyclically changes a gas as in the ALD method, it is unnecessary to carry the substrate holder 30 out of the processing container 11 during the process. For example, as in a second embodiment described below, the plasma ignition region may be reliably controlled during a process according to process conditions such as change in gas type and change in pressure, so that it is possible to implement a process, which better satisfies the demand to improve the in-plane uniformity of the film thickness and the film quality of a film formed on the wafers 2.

Second Embodiment

Ignition Control Method and Film Formation Method

Figure 10:
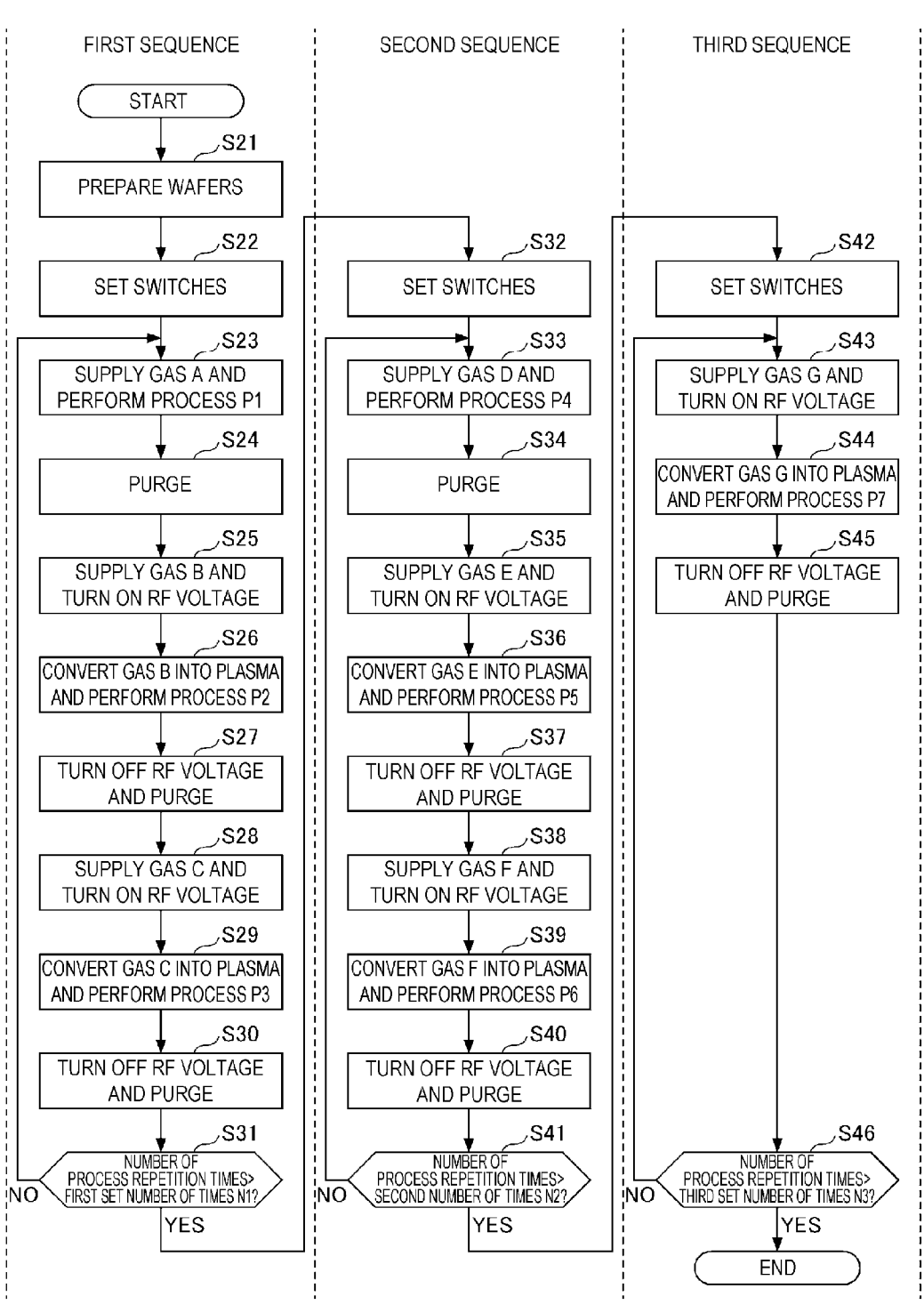
FIG. 10 is a flowchart illustrating an example of an ignition control method and a film formation method according to a second embodiment.

Next, an ignition control method and a film formation method according to a second embodiment will be described with reference to FIG. 10. FIG. 10 is a flowchart illustrating the ignition control method and the film formation method according to the second embodiment. The ignition control method of the present embodiment is performed by the substrate processing apparatus 10, and controlled by the control device 100. The substrate processing apparatus 10 performs the film formation process by the ALD method in the order of a first sequence, a second sequence, and a third sequence under the control of the control device 100. The ignition control method of the present embodiment will be described taking the configuration of the matching unit 53 in FIG. 2 as an example. A film formed by the film formation process results from gases A to G.

When the present method starts, in step S21, the control device 100 carries the substrate holder 30 holding the wafers 2 into the processing container 11.

Subsequently, in step S22, the control device 100 sets the first switch "a" and the second switch "b." When the desired plasma ignition region is the plasma box 19, the control device 100 sets the first switch "a" and the second switch "b" to ON. When the desired plasma ignition region is the inside of the processing container 11, the control device 100 sets one or both of the first switch "a" and the second switch "b" to OFF.

Subsequently, in step S23, the control device 100 supplies a gas A, and performs a process P1 using the gas A. For example, in the process P1 of step S23, the gas A is adsorbed onto the wafers 2 without using plasma. Then, in step S24, the control device 100 stops the supply of the gas A, and supplies a purge gas into the processing container 11 to replace the gas A remaining inside the processing container 11 with the purge gas.

Subsequently, in step S25, the control device 100 supplies a gas B, and applies the radio-frequency voltage. Then, in step S26, the control device 100 converts the gas B into plasma, and performs a process P2 using the plasma generated from the gas B. For example, in the process P2, the plasma of the gas B modifies the film formed on the wafers 2 or accelerates the chemical reaction of the film. Subsequently, in step S27, the control device 100 stops the application of the radio-frequency voltage and the supply of the gas B, and supplies a purge gas into the processing container 11 to replace the gas B remaining inside the processing container 11 with the purge gas.

Subsequently, in step S28, the control device 100 supplies a gas C, and applies the radio-frequency voltage. Then, in step S29, the control device 100 converts the gas C into plasma, and performs a process P3 using the plasma generated from the gas C. For example, in the process P3, the plasma of the gas C modifies the film formed on the wafers 2 or accelerates the chemical reaction of the film such as such as nitriding or oxidation of the film. Subsequently, in step S30, the control device 100 stops the application of the radio-frequency voltage and the supply of the gas C, and supplies a purge gas into the processing container 11 to replace the gas C remaining inside the processing container 11 with the purge gas.

Subsequently, in step S31, the control device 100 determines whether the process has been repeated more times than a first set number of times N (N≥1). When it is determined that the process has not been repeated more times than the first set number of times N1, the control device 100 returns to step S23 to repeat the cycle including steps S23 to S30.

When it is determined in step S31 that the process has been repeated more times than the first set number of times N1, the control device 100 shifts from the first sequence to the second sequence to set the switches in step S32, since the film with the desired film thickness and film quality has been formed.

In step S32, when the desired region where plasma is to be ignited in steps S36 and S39 is the plasma box 19, the control device 100 sets the first switch "a" and the second switch "b" to ON. When the desired plasma ignition region is the inside of the processing container 11, the control device 100 sets one of the first switch "a" and the second switch "b" to OFF and the other to ON.

Subsequently, in step S33, the control device 100 supplies a gas D, and performs a process P4 using the gas D. Then, in step S34, the control device 100 stops the supply of the gas D, and supplies a purge gas into the processing container 11 to replace the gas D remaining inside the processing container 11 with the purge gas.

Subsequently, in step S35, the control device 100 supplies a gas E, and applies the radio-frequency voltage. Then, in step S36, the control device 100 converts the gas E into plasma, and performs a process P5 using the plasma generated from the gas E. Subsequently, in step S37, the control device 100 stops the application of the radio-frequency voltage and the supply of the gas E, and supplies a purge gas into the processing container 11 to replace the gas E remaining inside the processing container 11 with the purge gas.

Subsequently, in step S38, the control device 100 supplies a gas F, and applies the radio-frequency voltage. Then, in step S39, the control device 100 converts the gas F into plasma, and performs a process P6 using the plasma generated from the gas F. Subsequently, in step S40, the control device 100 stops the application of the radio-frequency voltage and the supply of the gas F, and supplies a purge gas into the processing container 11 to replace the gas F remaining inside the processing container 11 with the purge gas.

Subsequently, in step S41, the control device 100 determines whether the process has been repeated more times than a second set number of times N (N≥1). When it is determined that the process has not been repeated more times than the second set number of times N2, the control device 100 returns to step S33 to repeat the cycle including steps S33 to S40.

When it is determined in step S41 that the process has been repeated more times than the second set number of times N2, the control device 100 shifts from the second sequence to the third sequence to set the switches in step S42, since the film with the desired film thickness and film quality has been formed.

In step S42, the control device 100 sets the first switch "a" and the second switch "b." When the desired plasma ignition region is the plasma box 19, the control device 100 sets the first switch "a" and the second switch "b" to ON. When the desired plasma ignition region is the inside of the processing container 11, the control device 100 sets one of the first switch "a" and the second switch "b" to OFF and the other to ON.

Subsequently, in step S43, the control device 100 supplies a gas G, and applies the radio-frequency voltage. Then, in step S44, the control device 100 converts the gas G into plasma, and performs a process P7 using the plasma generated from the gas G. Subsequently, in step S45, the control device 100 stops the application of the radio-frequency voltage and the supply of the gas G, and supplies a purge gas into the processing container 11 to replace the gas G remaining inside the processing container 11 with the purge gas.

Subsequently, in step S46, the control device 100 determines whether the process has been repeated more times than a third set number of times N3 (N≥1). When it is determined that the process has not been repeated more times than the third set number of times N3, the control device 100 returns to step S43 to repeat the cycle including steps S43 to S45.

When it is determined in step S46 that the process has been repeated more times than the third set number of times N, the control device 100 terminates the process, since the film with the desired film thickness and film quality has been formed.

The ignition control method and the film formation according to the second embodiment of FIG. 10 are examples, and the number of sequences is not limited to three as long as a plurality of sequences is included. Each sequence is not limited to the film formation by the ALD method, but may be, for example, a film formation, etching, or cleaning by a chemical vapor deposition (CVD) method.

When the ignition control method is performed by setting the switches between sequences, the plasma ignition region may be selected for each sequence. As a result, the plasma ignition region may be selectively changed without causing the occurrence of an abnormal discharge, and the in-plane uniformity of the film thickness and the film quality of the film formed on the wafers may be improved.

As described above, according to the ignition control method, the film formation method, and the substrate processing apparatus of the embodiments, the plasma ignition region may be selected from the plasma box and the processing container. As a result, the controllability of the film thickness and film quality of a film formed on the wafers 2 may be improved.

The ignition control method, the film formation method, and the substrate processing apparatus according to the embodiments described herein are merely examples in all aspects, but should not be construed as being limited. The embodiments may be modified and improved in various forms without departing from the scope and gist described in the claims attached herewith. The matters described in the plurality of embodiments above may adopt other configurations and may be combined with each other within the scope that does not cause any inconsistency.

The substrate processing apparatus of the present disclosure is any of an atomic layer deposition (ALD) apparatus, a capacitively coupled plasma (CCP) apparatus, an inductively coupled plasma (ICP) apparatus, a radial line slot antenna (RLSA), an electron cyclotron resonance plasma (ECR) apparatus, and a helicon wave plasma (HWP) apparatus.

According to an aspect of the present disclosure, the selectivity of a plasma ignition region in a substrate processing apparatus may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ignition control method comprising:
preparing a substrate processing apparatus including:
a processing container configured to accommodate a substrate,
a plasma box formed in the processing container,
a pair of electrodes disposed to sandwich the plasma box therebetween,
a radio-frequency (RF) power supply connected to the pair of electrodes via a matching box, and
a switch disposed between the matching box and one of the pair of electrodes;
setting the switch during a process performed by the substrate processing apparatus based on a recipe; and
after setting the switch, selecting a region for igniting a plasma generated from a gas by applying a radio-frequency voltage from the RF power supply,
wherein a first voltage supply line connects the matching box and the one of the pair of electrodes, and the switch is disposed in a second voltage supply line that branches from the first voltage supply line and is connected to a ground potential of the matching box.

2. The ignition control method according to claim 1, wherein in the selecting the region for igniting the plasma, the region for igniting the plasma is selected from the plasma box and the processing container.

3. The ignition control method according to claim 1, further comprising:
setting the switch before the process,
wherein the switch is set again during the process.

4. The ignition control method according to claim 1, wherein the process is an atomic layer deposition (ALD) process performed by repeating a plurality of steps, and
in a step of generating the plasma among the plurality of steps, the switch is set before generating the plasma.

5. A film formation method comprising:
preparing a substrate processing apparatus including:
a processing container configured to accommodate a substrate,
a plasma box formed in the processing container,
a pair of electrodes disposed to sandwich the plasma box therebetween,
a radio-frequency (RF) power supply connected to the pair of electrodes via a matching box, and
a switch disposed between the matching box and one of the pair of electrodes; and
performing a process based on a recipe, the process including:
(a) supplying a raw material gas to adsorb the raw material gas onto the substrate, and
(b) supplying a reaction gas to cause a reaction of the raw material gas adsorbed onto the substrate by a plasma generated from the reaction gas,
wherein, in (b), a region for igniting the plasma is selected by applying a radio-frequency voltage from the RF power supply, and
a first voltage supply line connects the matching box and the one of the pair of electrodes, and the switch is disposed in a second voltage supply line that branches from the first voltage supply line and is connected to a ground potential of the matching box.

6. The film formation method according to claim 5, wherein the process further includes
(c) repeatedly performing (a) and (b),
wherein after the switch is set each time (b) is performed during (c), the region for igniting the plasma is selected by applying the radio-frequency voltage from the RF power supply.

7. A film formation method comprising:
preparing a substrate processing apparatus including:
a processing container configured to accommodate a substrate,
a plasma box formed in the processing container,
a pair of electrodes disposed to sandwich the plasma box therebetween,
a radio-frequency (RF) power supply connected to the pair of electrodes via a matching box, and
a switch disposed between the matching box and one of the pair of electrodes; and
performing a process based on a recipe, the process including:
performing a first sequence, which includes at least one step, a first set number of times, and
after performing the first sequence, performing a second sequence, which includes at least one step, a second set number of times,
wherein in a step of generating a plasma from a gas during the first sequence and the second sequence, the switch is set, and then, a region for igniting the plasma is selected by applying a radio-frequency voltage from the RF power supply, and
a first voltage supply line connects the matching box and the one of the pair of electrodes, and the switch is disposed in a second voltage supply line that branches from the first voltage supply line and is connected to a ground potential of the matching box.

8. A substrate processing apparatus comprising:

a processing container configured to accommodate a substrate;

a plasma box formed in the processing container;

a pair of electrodes disposed to sandwich the plasma box therebetween;

a radio-frequency (RF) power supply connected to the pair of electrodes via a matching box;

a switch disposed between the matching box and one of the pair of electrodes; and a controller configured to perform a process including:

setting the switch during a process performed by the substrate processing apparatus based on a recipe, and after setting the switch, selecting a region for igniting a plasma generated from a gas by applying a radio-frequency voltage from the RF power supply, wherein a first voltage supply line connects the matching box and the one of the pair of electrodes, and the switch is disposed in a second voltage supply line that branches from the first voltage supply line and is connected to a ground potential of the matching box.

\*     \*     \*     \*     \*